United States Patent [19]
Hung et al.

[11] Patent Number: 5,982,250
[45] Date of Patent: Nov. 9, 1999

[54] MILLIMETER-WAVE LTCC PACKAGE

[75] Inventors: Hingloi A. Hung, Arcadia; Randy J. Duprey, Manhattan Beach; Raquel T. Villeages, Redondo Beach, all of Calif.

[73] Assignee: TWR Inc., Redondo Beach, Calif.

[21] Appl. No.: 08/978,764

[22] Filed: Nov. 26, 1997

[51] Int. Cl.$^6$ ....................................................... H01P 5/107
[52] U.S. Cl. ............................................. 333/26; 333/246
[58] Field of Search ........................................ 333/26, 33

[56] References Cited

U.S. PATENT DOCUMENTS

| | | | |
|---|---|---|---|
| 4,716,386 | 12/1987 | Lait | 333/26 |
| 4,901,040 | 2/1990 | Ahlborn et al. | 333/26 |
| 5,414,394 | 5/1995 | Gamand et al. | 333/26 |
| 5,770,981 | 6/1998 | Koizumi et al. | 333/26 |

*Primary Examiner*—Paul Gensler
*Attorney, Agent, or Firm*—Michael S. Yatsko

[57] ABSTRACT

A waveguide to microstrip transition (124) formed in a multi-layer substrate (208) is disclosed. The waveguide to microstrip transition (124) may be incorporated into a hermetically sealed package including a metal base (202), a multi-layer circuit (208), a metal ring (206), and a metal cover (204). The multi-layer circuit (208) has at least a first dielectric layer (230), a second dielectric layer (222), and a first conductive layer (218) disposed between the bottom side of the first dielectric layer (230) and the top side of the second dielectric layer (222). The multi-layer circuit (208) includes a waveguide (234). An electromagnetically reflective material (236) coats the walls of the waveguide (234) to allow signals to propagate by reflection through the waveguide (234) toward the first dielectric layer (230). Plated through vias (126) are located in at least the first dielectric layer (230). The plated through vias (126) are arranged to form an approximate outline around the land region on the first dielectric layer (230). The plated through vias (126) form a waveguide extension to the waveguide (234) that guides signals through the first dielectric layer. A microstrip (112) is located on the top side of the first dielectric layer (230). The microstrip (112) connects to an E-plane probe (113) located over the waveguide (234) and inside the waveguide extension.

30 Claims, 3 Drawing Sheets

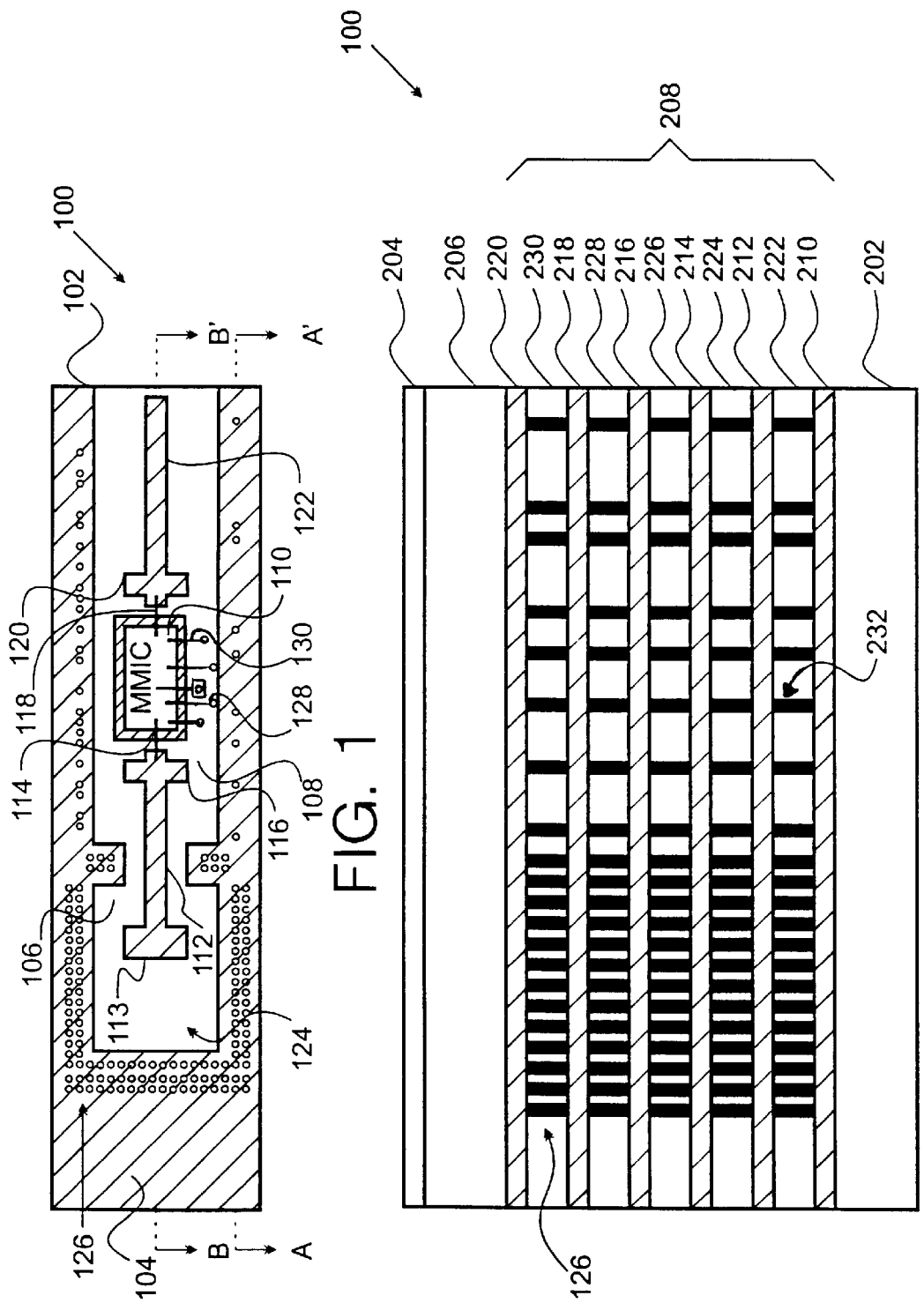

MILLIMETER-WAVE LTCC PACKAGE

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of contract No. DAAL01-95-C-3536.

BACKGROUND OF THE INVENTION

The present invention relates to an apparatus for coupling a signal traveling in a waveguide onto a microstrip. More specifically, the invention relates to the construction of a waveguide to microstrip transition as a directly fabricated and hermetically sealed packaging structure, which may also connect the microstrip to integrated circuits operating at millimeter-wave or microwave frequencies.

Both waveguides and microstrips are devices that transport electromagnetic energy (hereafter "signals") from point to point. A waveguide is generally implemented as a conduit with an inner electromagnetically reflecting surface. Signals introduced into the interior of the waveguide propagate along the interior of the waveguide by reflecting back and forth between the walls of the waveguide. Waveguides are generally circular or rectangular in cross-section and provide for low loss transmission of the signals.

Waveguides have a critical wavelength for passage of signals within, related to the waveguide geometry. Signals with wavelengths greater than the critical wavelength are unable to propagate in the waveguide. Thus, the structure of the waveguide intrinsically serves to filter out undesired signals. It is often necessary, for example in satellite applications, to process the signal with integrated circuitry. However, a complication involved in constructing waveguides connected to integrated circuitry is that the waveguide structure tends to be large in relation to the integrated circuitry. Thus, in the past, waveguides required additional fabrication steps, incurred additional cost, and suffered from lower reliability when used in conjunction with integrated circuitry, including microstrips.

A microstrip is a thin conducting strip placed on top of a dielectric material. The dielectric material, in turn, is supported by a conducting plate, typically grounded. A microstrip can be fabricated directly in an integrated circuit process by depositing a thin conducting strip on the surface of the substrate. An entire set of integrated circuit electronics, including a microstrip, often occupies far less geometric volume than the corresponding waveguide structure. Microstrips are suitable for use as a high bandwidth, miniaturized, cost effective signal transmission line. Because of these advantages, microstrip lines are used in a great number of commercial microwave and millimeter-wave applications.

Many commercial and military satellite systems, for example, use microstrips coupled to waveguides in different portions of the system. For example, a satellite antenna may guide an uplink beam through a waveguide, then to a downconverter connected to a microstrip for processing. Thus, a key factor in the operation of commercial and military satellite systems is a waveguide to microstrip transition which provides low loss signal coupling between the microstrip and the waveguide.

One patent related to coupling signals between waveguides and microstrips is U.S. Pat. No. 4,453,142 to Earl R. Murphy entitled Microstrip to Waveguide Transition. Murphy discloses a microstrip to waveguide transition for use in the millimeter-wave frequency range. Murphy's waveguide consists of a solid metal rectangular waveguide that is attached to a substrate. A tab of the substrate carrying the microstrip extends into the waveguide.

The solid metal waveguide used in Murphy is rigidly connected to the base, for example by bolting. A wall of the waveguide is pierced to provide an opening for the microstrip. The base, waveguide, and microstrip are assembled to provide a waveguide to microstrip transition. Because the microstrip extends through a metallic wall of the waveguide, the microstrip is necked to help minimize shunt capacitance between the microstrip and the waveguide. Murphy, however, does not address the difficulties associated with forming a waveguide to microstrip transition in a single, easy to manufacture integrated circuit package.

Other prior waveguide to microstrip designs use microstrip, stripline, and coaxial interfaces to construct input/output ports to the microstrip. While these interfaces serve to provide low loss transmission of the internal signal to the external connections over a wide range of frequencies, acceptable performance of these interfaces requires complicated and time consuming circuit tuning unsuitable for large volume manufacturing. Furthermore, previous approaches employing multi-layer Low Temperature Co-fired Ceramic (LTCC) substrates for monolithic millimeter-wave integrated circuit (MMIC) packaging applications have been limited by the input/output frequency (microwaves) interface. The conventional interface uses microstrip and stripline structures to launch microwaves onto the substrate. The conventional interface yields poor electrical performance at millimeter-wave frequencies because of parasitic inductance and capacitance and other high frequency effects, thereby limiting usefulness to frequencies below 40 GHz.

A need remains for an improved transition structure from waveguide to microstrip on multi-layer substrate which overcomes the disadvantages discussed above and previously experienced.

BRIEF SUMMARY OF THE INVENTION

Therefore, it is an object of the present invention to provide a waveguide to microstrip transition integrated with a multi-layer LTCC substrate package.

It is another object of the present invention to provide a waveguide to microstrip transition in an integrated circuit package which can be easily fabricated.

It is a further object of the present invention to provide a waveguide to microstrip transition which can be inexpensively fabricated.

Another object of the present invention is to provide complete support for the microstrip in a waveguide to microstrip transition so that operating or insertion stresses do not cause malfunctions.

Another object of the present invention is to provide a waveguide to microstrip transition that is hermetically sealed so that when the transition is integrated in a millimeter-wave package where the integrated circuits reside, particulate matter does not interact unfavorably with the integrated circuits.

Another object of the present invention is to provide a waveguide to microstrip transition that is effective at millimeter-wave and microwave frequencies.

The waveguide to microstrip transition of the present invention includes a multi-layer substrate. The multi-layer substrate has a first dielectric layer, a second dielectric layer, and a first conductive layer disposed between the bottom side of the first dielectric layer and the top side of the second dielectric layer. The first conductive layer is selectively patterned such that conductive material is removed underneath the microstrip on the first dielectric layer.

The multi-layer substrate includes a waveguide formed by removing material from the second dielectric layer and selectively patterning the first conductive layer. The removed material forms walls defining the waveguide. The waveguide may be extended through third, fourth, fifth, or additional dielectric and conductive layers. An electromagnetically reflective material coats the walls of the waveguide to allow signals to propagate by reflection through the waveguide toward the first dielectric layer. Optionally, the reflective material may be omitted and the waveguide formed by a series of plated via holes through the multi-layer substrate.

A conductive coating is placed on the top side of the first dielectric layer, but the conductive coating need not cover the entire first dielectric layer. Rather, the conductive coating is selectively patterned to form an opening (an absence of conductive coating) and a conductive probe over the waveguide on the first dielectric layer. The conductive coating may also be patterned to provide regions for placement of integrated circuit signal processing devices and to provide conductive areas connecting to a metal ring frame to form side walls of a complete package as well as a waveguide cavity.

Metallic plated through vias (or vias filled completely with metal) are located in at least the first dielectric layer. The plated through vias are arranged to form an approximate outline around the land region on the first dielectric layer. The plated through vias form part of the waveguide structure that guides signals through the first dielectric layer.

A microstrip is located on the top side of the first dielectric layer. The top metal of the microstrip partially extends into the land region and is therefore located over the waveguide and inside the via outline. Signals travel through the waveguide, through the first dielectric layer (guided by the vias), and onto the microstrip.

The waveguide to microstrip transition and associated multi-layer packaging of the present invention are suitable for use with microwave and millimeter-wave frequencies (approximately 20–100 GHz) with very low insertion loss. The multi-layer packaging offers routing of DC and microwave/millimeter-wave signals through the layers inside the package thereby minimizing the size of the package. As a result, applications (for example, phased-array antennas operating with millimeter-waves) which require large numbers of DC and RF control signal paths can readily make use of the low cost, high performance multi-layer package and associated waveguide to microstrip transition provided by the present invention.

BRIEF DESCRIPTION OF THE SEVERAL VIEWS OF THE DRAWINGS

FIG. 1 is a schematic top view of a multi-layer integrated circuit package with a waveguide to microstrip transition.

FIG. 2 is a schematic side view, taken along line A–A', of the multi-layer integrated circuit package shown in FIG. 1.

Turning now to FIG. 1, a view of a multi-layer integrated circuit package 100 is shown displaying the top side 102 of one dielectric layer in the package 100. The top side 102 is coated in a conductive coating 104, for example, a precious metal. The conductive coating 104 is selectively patterned to form a land region 106 on the top layer of the package 100. As used in this specification, the term "land region" indicates an area devoid of conductive coating. A second land region 108 and additional land regions (not shown) may also be formed by selective patterning to provide regions in which a millimeter-wave monolithic integrated circuit 110 (MMIC), or other signal processing circuit may be placed. For example, the MMIC 110 may provide the functionality of an amplifier, attenuator, switch, or filter.

Figure 3:
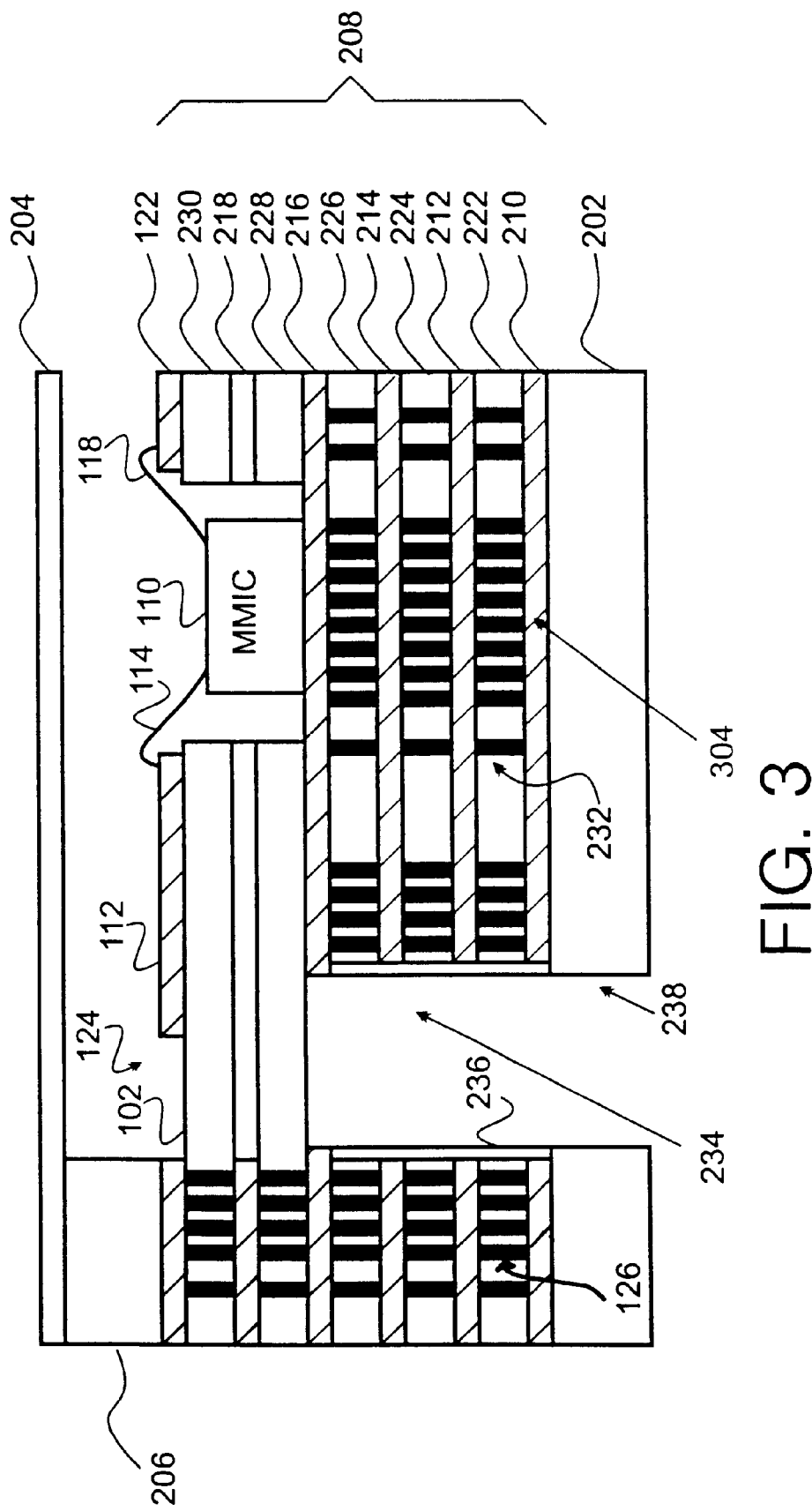
FIG. 3 is a schematic side view, taken along line B–B', of the multi-layer integrated circuit package shown in FIG. 1.

A microstrip 112 is formed on the top side 102. The microstrip 112 connects the land region 106 and the second land region 108. A bonding wire or ribbon 114 may be used to attach the microstrip to input/output pads of the MMIC 110. In addition, the geometry of the microstrip 112 near the MMIC may be altered by an impedance matching shape 116 in order to match the impedance of the microstrip 112 to the impedance of MMIC through the bonding wire 114. Additional bonding wires 118 may connect input/output ports of the MMIC 110 to a second impedance matching shape 120 on another microstrip 122 for connection to additional processing circuits (not shown). DC bias (or other signals) may then be connected from the vias 128 to the MMIC 110 by bond wires 130. The package 100 further includes an integrated waveguide to microstrip transition 124 (hereafter "transition 124"). As will be explained in more detail below, vias 126 are placed around the transition 124 to form an extension to a waveguide structure. Note also that a probe 113 (a T-shaped probe, or in general, an E-plane probe) may extend from the microstrip 112 into the transition 124 to help couple signals onto the microstrip 112. The probe 113 may be formed as a metal shape in the transition 124 under which there is no ground plane.

One aspect of the package 100 is illustrated in FIG. 2. FIG. 2 shows a side view, taken along line A–A', of the multi-layer integrated circuit package 100 shown in FIG. 1. Still referring to FIG. 2, the package 100 includes a metal base 202, a metal cover 204, a ring frame 206, and a multi-layer integrated circuit 208 (hereafter "circuit 208").

The circuit 208 includes conductive layers 210–220 (which may be filled, for example, with conductive metal) separated by dielectric layers 222–230. Note that any conductive layer may be selectively patterned to provide DC bias and signal routing. In a preferred embodiment, the circuit 208 is formed from dielectric layers created from Low Temperature Co-fired Ceramic (LTCC). Vias 232 are introduced into the circuit 208 to provide signal routing (including millimeter-wave signal, DC power, ground, and data) between the conductive layers 210–220 of the circuit 208. The package 100 also includes a waveguide structure which will be explained in more detail below with reference to FIG. 3 (which illustrates a side view of the transition 124 taken along line B–B' of FIG. 1).

In FIG. 3, the waveguide structure 234 may be created directly as part of the circuit 208 fabrication process. The circuit 208 thereby remains hermetically sealed, and easy to manufacture. The waveguide structure 234 may be created, for example, by punching out the dielectric layers 222–226 and screen patterning the conductive layers 210–216 at appropriate locations, co-firing the dielectric layers 222–226, and then depositing an electromagnetically reflective coating 236 over the surface of the punched out region to provide signal reflection in the waveguide structure 234.

The waveguide structure 234 continues through an opening 238 in the metal base 202 to reception or transmission structure, for example, a feedhorn (not shown. In an alternate embodiment, a series of plated vias extends through the dielectric layers 222–226 surrounding the waveguide structure 234, in addition to or as a substitute for the reflective coating 236 on the inside of the waveguide structure 234.

At least one dielectric layer of the dielectric layers 222–230 remains in the path of the waveguide and provides support for the microstrip 112. Signals move along the waveguide 234 and may, for example, pass through the dielectric layers 228–230. The signal does not move through the dielectric layers 228–230 in an unconstrained fashion, however. Rather, the vias 126 form a waveguide extension to the waveguide structure 234. To this end, the vias 126 are plated through with metal, and in a preferred embodiment, the vias 126 are completely filled with metal, contact the metal ring 206, and are connected to ground. As a result, signals pass through the waveguide 234, dielectric layers 228–230, and into the transition 124. In one embodiment of the present invention, the vias range in diameter from 0.010" to 0.018".

The transition 124 couples the signal onto the microstrip 112. The signal that passes through the waveguide 234 and dielectric layers 228–230 is reflected by the metal ring 206 which is capped by the metal cover 204. The metal cover 204 thereby acts as a back short for the waveguide structure 234. As a result, the signal is confined in the transition 124 and is coupled onto the microstrip 112.

Still with reference to FIG. 3, the microstrip 112 is shown in place on the top side 102 of the dielectric layer 230 and is fully supported by the dielectric layer 230. Portions of the conductive layer 218, however, are removed above the waveguide structure 234, below the microstrip 112 and below the microstrip 122. The conductive layer 216 may form the ground plane for the microstrips 112 and 122. Thus, signals may travel up the waveguide structure 234, through the dielectric layers 228 and 230, and into the transition 124. The number of dielectric layers, may be adjusted depending on the frequency of operation. The metal cover 204 and the metal ring 206 force the signal to be contained inside the transition 124. Because the microstrip 112 extends into the transition 124 and is exposed to the signal in the transition 124, the signal couples onto the microstrip 112 and may be processed by MMIC 110.

The MMIC 110 (and other processing circuitry in general), typically generates heat while operating. Therefore, a heat sink may be provided in the circuit 208 to protect the MMIC 110. A heat sink may be used, for example, to draw heat away from the MMIC 110 and thereby prevent the MMIC 110 from malfunctioning. One structure that may be used to implement a heat sink is a via structure 304 located underneath the MMIC 110. The via structure 304 uses a densely packed area of plated through or metal filled vias to create an area with a high concentration of metal. Because metal typically provides a high thermal conductivity path, the via structure 304 serves to draw heat away from the MMIC 110 to areas of the circuit 208 that effectively dissipate heat, for example, the metal base 202.

Figure 4:
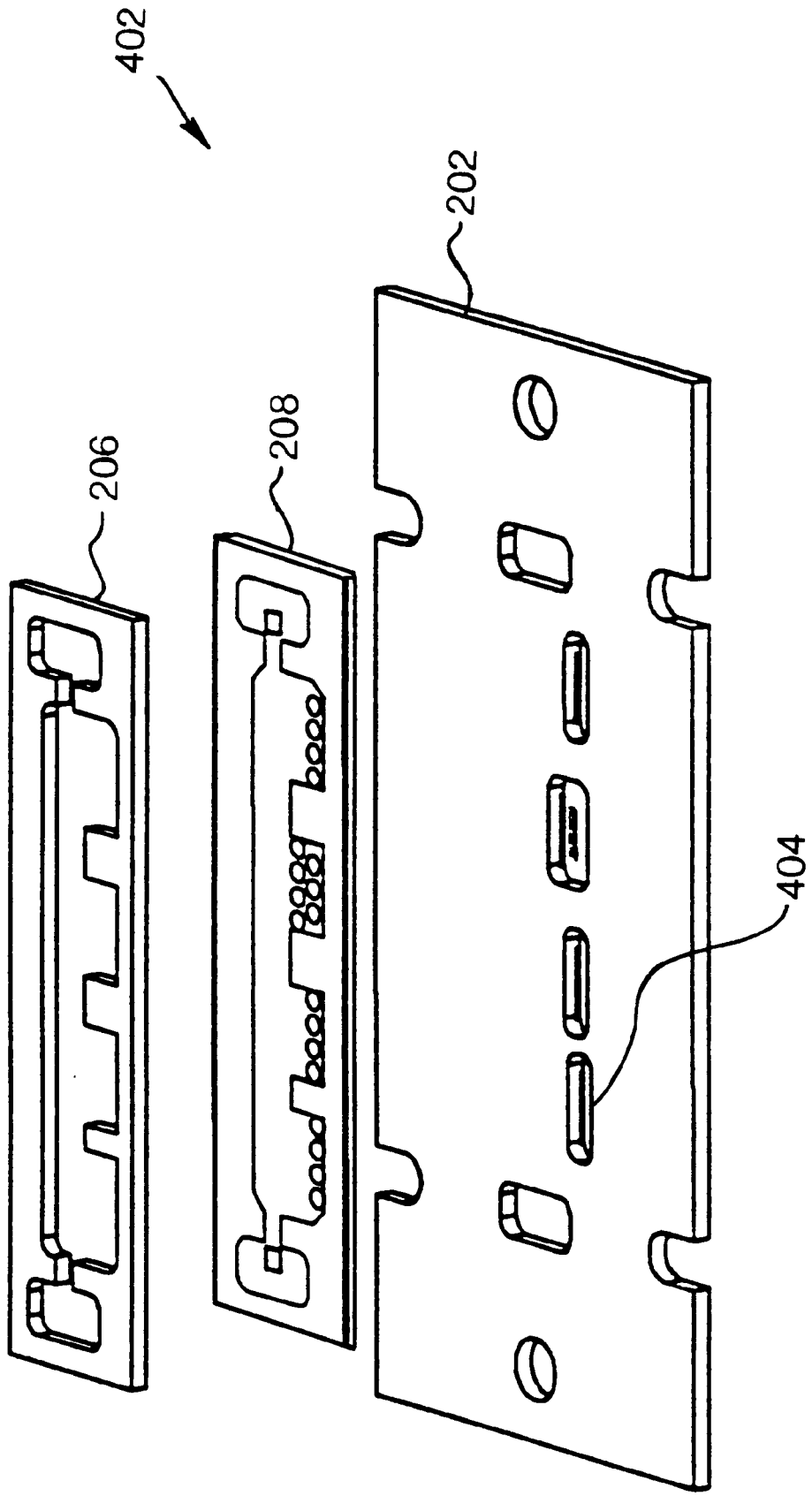
FIG. 4 shows an exploded view of the components that may be used to form a complete hermetically sealed package with waveguide to microstrip transitions.

The metal base 202, circuit 208, and metal ring 206 are shown in FIG. 4 constituting parts of a circuit module 402. The circuit 208 is placed between the metal base 202 and the metal ring 206. A metal cover (not shown) is connected to the top of the metal ring 206, for example by laser welding, to form one embodiment of a complete circuit module 402, including the backshort for the waveguide cavities. In one embodiment of the circuit module 402, the metal base 202 is formed from copper-tungsten, and the metal ring 206 is formed as a brazed metal ring that has a coefficient of thermal expansion compatible with the LTCC circuit 208. The metal base 202, circuit 208, metal ring 206, and metal cover 204 preferably form a hermetically sealed package. DC biasing to MMIC 110 can come through the holes 404 in the metal base 202, through vias 232 in the circuit 208, and, for example, to the patterned conductive layer 220. DC bias (or other signals) may then be connected from the vias 128 to the MMIC 110 by bond wires 130. Alternatively, the DC bias can also be connected to external supplies through any of the patterned conductive layers 210–220 from the side of the package 208.

While particular elements, embodiments and applications of the present invention have been shown and described, it will be understood, of course, that the invention is not limited thereto since modifications may be made by those skilled in the art, particularly in light of the foregoing instruction. It is therefore contemplated by the appended claims to cover such modifications and incorporate those features which come within the spirit and scope of the invention.

What is claimed is:

1. A waveguide to microstrip transition comprising:
   a multi-layer substrate comprising:
      a first dielectric layer having a top side and a bottom side;
      a second dielectric layer having a top side and a bottom side; and
      a first conductive layer disposed between said bottom side of said first dielectric layer and said top side of said second dielectric layer;
      said second dielectric layer having an aperture forming a waveguide;
      said first conductive layer having an aperture forming a waveguide and aligned with the aperture in said second dielectric layer;
   a conductive coating on said top side of said first dielectric layer, said conductive coating having an aperture aligned with the aperture in said second dielectric layer;
   a waveguide extension located in at least said first dielectric layer; and
   a microstrip located on said top side of said first dielectric layer inside the aperture described by said conductive coating.

2. The waveguide to microstrip transition of claim 1, wherein said waveguide extension comprises a plurality of plated through vias.

3. The waveguide to microstrip transition of claim 2, wherein said plurality of plated through vias approximates an outline around said waveguide.

4. The waveguide to microstrip transition of claim 2, wherein said plurality of plated through vias are filled with metal.

5. The waveguide to microstrip transition of claim 2, wherein said plurality of plated through vias are connected to a ground reference.

6. The waveguide to microstrip transition of claim 5, wherein said plurality of plated through vias approximates an outline around said waveguide.

7. The waveguide to microstrip transition of claim 1, further comprising at least one additional dielectric layer and at least one additional conductive layer, and wherein said waveguide continues through said at least one additional dielectric layer and said at least one additional conductive layer.

8. The waveguide to microstrip transition of claim 2, wherein said first dielectric layer and said second dielectric layer comprise low temperature co-fired ceramics.

9. The waveguide to microstrip transition of claim 8, wherein said plurality of plated through vias are connected to ground.

10. The waveguide to microstrip transition of claim 9, wherein said plurality of plated through vias approximates an outline around said waveguide.

11. A circuit module comprising:
    a multi-layer substrate comprising:
        a first dielectric layer having a top side and a bottom side;
        a second dielectric layer having a top side and a bottom side; and
        a first conductive layer disposed between said bottom side of said first dielectric layer and said top side of said second dielectric layer,
        said second dielectric layer having an aperture forming a waveguide;
        said first conductive layer having an aperture forming a waveguide and aligned with the aperture in said second dielectric layer;
    a conductive coating on said top side of said first dielectric layer, said conductive coating having an aperture aligned with the aperture in said second dielectric layer;
    a waveguide extension located in at least said first dielectric layer; and
    a microstrip located on said top side of said first dielectric layer inside the aperture described by said conductive coating; and
    a metal base supporting said multi-layer substrate, said metal base having an aperture aligned with the aperture in said second dielectric layer;
    a metal ring supported by said multi-layer substrate, said metal ring aligned with the aperture in said second dielectric; and
    a metal cover on top of said metal ring.

12. The circuit module of claim 11, wherein said metal base, said metal ring, said metal cover, and said multi-layer substrate comprise a hermetically sealed package.

13. The circuit module of claim 11, wherein said metal base comprises a copper-tungsten alloy.

14. The circuit module of claim 11, wherein said metal ring is connected to ground.

15. The circuit module of claim 11, wherein said waveguide extension comprises a plurality of plated through vias.

16. The circuit module of claim 15, wherein said plurality of plated through vias approximates an outline around said waveguide.

17. The circuit module of claim 16, further comprising at least one processing circuit connected to said microstrip.

18. The circuit module of claim 17, further comprising a heat sink located in proximity to said at least one processing circuit.

19. The circuit module of claim 18, wherein said heat sink comprising a plurality of plated through vias located underneath said processing circuit.

20. The circuit module of claim 17, wherein said at least one processing circuit comprises a MMIC.

21. The waveguide to microstrip transition of claim 15, wherein said plurality of plated through vias approximates an outline defining said waveguide.

22. The circuit module of claim 11, wherein said waveguide extension comprises a plurality of plated through vias.

23. The circuit module of claim 22, wherein said plurality of plated through vias approximates an outline around said waveguide.

24. The circuit module of claim 11, further comprising at least one additional dielectric layer and at least one additional conductive layer, and wherein said waveguide continues through said at least one additional dielectric layer and said at least one additional conductive layer.

25. A waveguide to microstrip transition comprising:
    a base of conducting material having an aperture forming a waveguide;
    alternating layers of dielectric and conductor positioned on top of said base, each layer of dielectric and conductor having an aperture aligned with the aperture in said base forming a waveguide;
    at least one sealing layer of dielectric positioned on top of said alternating layers of dielectric and conductor, said sealing layer extending across the entire aperture of said alternating layers of dielectric and conductor, said sealing layer having a plurality of metallized vias forming a waveguide extension surrounding the aperture of said alternating layers of dielectric and conductor;
    a microstrip positioned on top of said sealing layer, said microstrip aligned with the aperture of said alternating layers of dielectric and conductor;
    a ring frame of conducting material positioned on top of said sealing layer aligned with the aperture in said base forming a waveguide surrounding said microstrip; and
    a lid of conducting material positioned on top of said metallic ring frame.

26. The transition of claim 25 wherein a metallic conductive coating is deposited on the surface of the waveguide formed by said alternating layers of dielectric and conductor.

27. The transition of claim 22 wherein said sealing layer includes a plurality of rows of a plurality of metallized vias surrounding the aperture of said alternating layers of dielectric and conductor, each metallized row of vias at a different distance from the aperture.

28. The transition of claim 25 further comprising:
    at least one processing circuit connected to said microstrip; and
    a heat sink located in proximity to said at least one processing circuit.

29. The transition of claim 28 wherein said heat sink comprises a plurality of metallized vias located inderneath said processing circuit.

30. The transition of claim 28 wherein said heat sink comprises said base of conducting material connected to said processing circuit by a plurality of metallized vias.

* * * * *